United States Patent
Kosky et al.

[11] Patent Number: 5,252,800
[45] Date of Patent: Oct. 12, 1993

[54] APPARATUS FOR PREPARING SUPERCONDUCTING JOINTS

[75] Inventors: Philip G. Kosky, Schenectady; Herbert C. Peters, Ballston Spa, both of N.Y.

[73] Assignee: General Electric Company, Schenectady, N.Y.

[21] Appl. No.: 804,318

[22] Filed: Dec. 5, 1991

[51] Int. Cl.⁵ .............................................. B23K 1/012
[52] U.S. Cl. ...................... 219/85.1; 118/715; 505/925; 505/927
[58] Field of Search ............... 219/85.1; 118/715, 725, 118/718; 505/826, 925, 927; 29/599

[56] References Cited

U.S. PATENT DOCUMENTS

| | | | |
|---|---|---|---|
| 3,985,281 | 10/1976 | Diepers et al. | 505/927 |
| 5,082,164 | 1/1992 | Rumaner et al. | 505/925 |
| 5,104,030 | 4/1992 | Ranze | 29/599 |
| 5,109,593 | 5/1992 | Benz et al. | 505/925 |
| 5,134,040 | 7/1992 | Benz et al. | 505/927 |

FOREIGN PATENT DOCUMENTS 1302676 12/1989 Japan ................................ 29/599

Primary Examiner—Geoffrey S. Evans
Attorney, Agent, or Firm—William H. Pittman

[57] ABSTRACT

An apparatus for forming a superconductive joint in tape or wire has features which include a closeable vessel with gas inlets for depositing a superconducting layer by chemical vapor deposition, and a form in combination with current clamps and conductive leads to heat a length of tape to a temperature effective to deposit a superconductive coating thereon. Preferably, the form and associated structure are unitary with a base plate which seals the vessel.

11 Claims, 4 Drawing Sheets

APPARATUS FOR PREPARING SUPERCONDUCTING JOINTS

This invention relates to superconductors, and more particularly to the preparation of superconducting joints.

Superconducting coils are widely used or have potential use in various applications such as in accelerators and nuclear magnetic resonance imaging equipment. In general, these coils are formed by winding superconducting wire or tape around a core element. The word "tape" as used hereinafter includes both tape and wire, although in its primary meaning it designates an elongate body having relatively large length and width dimensions and a small thickness dimension.

In general, superconducting tapes are prepared by depositing a superconducting layer on a core of a parent metal such as niobium, tantalum, titanium or vanadium, most often containing small percentages of other materials such as zirconium and oxygen. The core is necessary to afford strength to the tape, since the superconductive material therein is typically an intermetallic material with essentially no intrinsic strength. It most often comprises a combination of the parent metal with a reactive metal or metalloid such as tin, aluminum, silicon, gallium or germanium. Tin is most often employed by reason of its availability, relatively low cost and suitability. A superconductive material in common use corresponds generally to the formula $Nb_3Sn$, sometimes designated hereinafter "triniobium tin".

A superconducting layer of triniobium tin on a niobium core may be prepared by passing said core continuously through a bath of tin or a tin alloy, whereupon the core picks up a thin layer of tin which, upon heating, forms triniobium tin in the region nearest the core. The connective and superconductive layer thus obtained becomes enriched in tin as the distance from the core increases with the outer surface being essentially pure tin. It is also known to employ for this purpose a chemical vapor deposition (hereinafter sometimes "CVD") process in which a combination of tin and niobium halides is reduced by elemental hydrogen to the elemental metals, which deposit on the core.

Further steps are generally necessary to produce a tape of the desired strength and ductility. Most often, a cladding layer of a substantially chemically inert but electrically conductive metal (e.g., copper) is applied on the outer surface of the superconducting layer to protect it from chemical attack and to provide an electrical shunt path. Application of this cladding layer is typically by soft soldering when said outer surface is essentially tin. In certain instances, an insulator such as varnish may in turn be applied to the cladding layer. Similar methods may be employed for the production of superconducting tapes containing other core and superconductive materials.

Present and future generations of superconducting devices require very long superconducting coils, often substantially greater than one kilometer. However, present technology makes it difficult to fabricate continuous superconducting coils with lengths greater than about 300 meters. For the preparation of longer tape coils, therefore, it is often desirable to splice together several lengths of tape, with the joints between such lengths themselves being superconducting.

The preparation of superconducting joints between successive lengths of tape presents several daunting obstacles. In order for operation in a persistent superconductive mode to be practical, there should be no substantial current loss in passage through the joint; otherwise, continual replenishment of power will be necessary, substantially increasing the cost of the apparatus. In addition, the joint is frequently a heat source by reason of its relatively high resistivity, and may propagate a quench front of an intensity too great for handling by the cladding layer. If that happens, superconductivity in the entire coil will be quenched. One result might be a release of catastrophically unsafe amounts of magnetic energy.

Various methods for producing superconducting joints are known in the art. One such method, disclosed in U.S. Pat. No. 4,744,506, involves the use of a superconductive lead-bismuth solder. Such solders are not, however, operative in very high magnetic fields. Moreover, they pass only a relatively low current density, which means that solder joints on the order of one meter or greater in length may be necessary in a superconducting coil.

More recently, various methods of producing superconducting joints by welding have been made available. Copending, commonly owned U.S. Pat. No. 5,109,593 discloses a method in which the substantially inert metal layer is removed from tape ends to be joined, after which the exposed inner sections typically comprising niobium and triniobium tin are placed in contact, melted and resolidified. A continuous precipitate of the superconductive alloy is thus formed.

Another welding method is disclosed in copending, commonly owned U.S. Pat. No. 5,082,164. In this method, the substantially inert metal layer and the superconducting layer are both removed from the tape ends to be joined, exposing the core. The core sections are then placed in contact and heated in a protective atmosphere such as helium or argon, in the presence of excess reactive metal which forms a continuous layer of the superconductive alloy.

These welding methods are, in many ways, superior to previously known methods for joining superconducting tapes. However, there is still a substantial probability of failure of at least one welded joint in a length of tape containing many such joints. It would be desirable, therefore, to provide an alternative method for preparing superconducting joints which could be used either in place of welding, or in addition to welding to provide a backup superconductive path.

In particular, CVD method for producing superconducting joints would be advantageous. Since CVD methods for producing continuous lengths of superconducting tape are known, it would at first sight appear to be a simple matter to adapt one of them to the fabrication of joints. However, the tape CVD methods are based on steady state operation, which is not feasible for the fabrication of numerous isolated joints.

Thus, there still exists a need to develop a CVD method for making connective superconducting joints, as well as apparatus in which said method can be conducted. The present invention provides such an apparatus.

Accordingly, the invention includes apparatus for forming a superconductive joint, said apparatus comprising:

a closable vessel resistant to metal halides in the vapor state, comprising a housing and a top plate;

feed means in said vessel for reactive and inert gases;

exhaust means in said vessel for venting by-product gases;

base means adapted for sealable mounting to form the closure of said vessel;

entry slots in said base means to accommodate an internal length of an elongated superconductor, said entry slots being adapted to sealably contact said superconductor when said base means is mounted in said vessel;

forming means for forming a superconductive joint in said superconductor, said means comprising a heat-resistant and chemically inert curved mount for said superconductor with a gap in the surface thereof;

heat-resistant securing means for securing said superconductor to said forming means; and current passage means for passing an electric current through said superconductor when in contact with said forming means.

In the drawings, which represent views of a CVD apparatus according to the invention:

Figure 1:
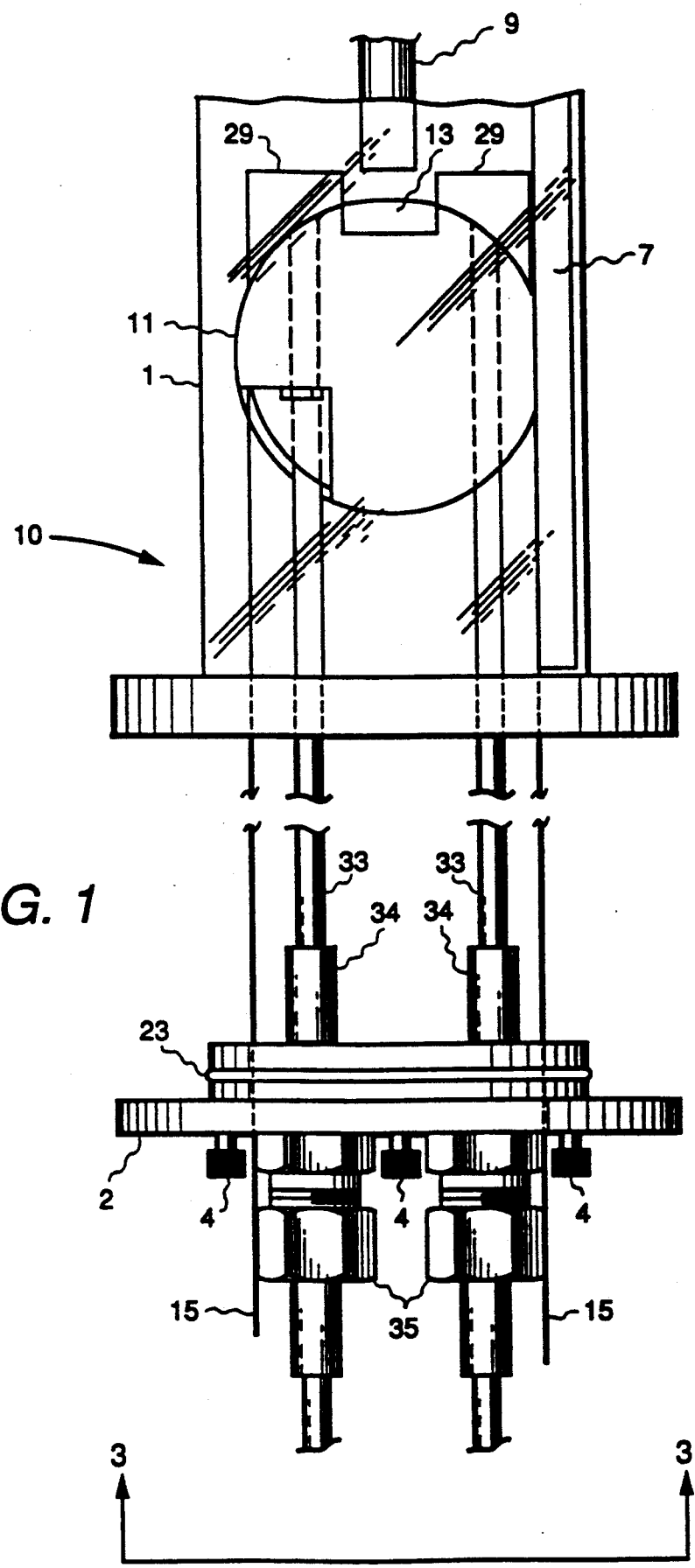
FIGS. 1 and 2 are transverse views of opposite ends of the apparatus, the former being shown partially disassembled.

The apparatus of this invention is particularly suitable for use with a method for producing a superconducting joint between ends of continuous superconductors, each of said ends comprising a parent metal core and a superconductive alloy layer thereon, said superconductive alloy layer comprising a combination of said parent metal and at least one reactive metal; said method comprising the steps of:

(A) removing any non-superconductive material from said ends;

(B) placing said ends in contact and physically joining them with an electrically conductive joint;

(C) depositing a connecting superconductive alloy layer on said ends by a chemical vapor deposition reaction of hydrogen with halides of said parent and reactive metals at a temperature in the range of about 700°–950° C.;

(D) cooling said joined ends;

(E) depositing on said joined ends a solder-accepting pure metal; and (F) covering said joined ends with a substantially chemically inert but electrically conductive cladding layer;

step C being conducted in an anhydrous inert atmosphere free from elemental oxygen, and step D in an anhydrous inert atmosphere free from elemental hydrogen and elemental oxygen. Said method is disclosed and claimed in copending application Ser. No. 07/802,970.

The parent metals and reactive metals employed in the superconducting tapes treated by the above-summarized method are known in the art, and many of them are listed hereinabove. In general, the preferred parent and reactive metals are niobium and tin, respectively. It may occasionally be advantageous to substitute germanium for tin as the reactive metal.

As previously mentioned, superconducting tapes generally have a cladding layer of a substantially inert metal such as copper over a layer of substantially pure tin. Both of these layers are essentially non-superconducting, or at least do not pass the required current density levels superconductively. The substantially pure tin forms the outer portion of the triniobium tin superconducting layer. It is necessary in step A to remove any such non-superconductive materials. This may be achieved by etching the tape ends, typically to a length of about 4–5 cm., with an acid which is reactive with the non-superconductive metal(s). Concentrated mineral acids are particularly useful for this purpose, with nitric acid generally being preferred when the cladding metal is copper.

After removal of the non-superconductive material, in step B the tape ends are physically joined with an electrically conductive joint. This is typically achieved by a welding operation. The joint thus obtained need not be superconductive, but of course if a backup superconductive path is desired, a superconducting joint must be provided. One of the welding operations disclosed in the aforementioned commonly owned applications, the disclosures of which are incorporated by reference herein, may be employed for this purpose. Particularly preferred, by reason of its simplicity, is the method of Ser. No. 07/561,438 which requires only a single welding step without multiple stripping operations.

Steps C and D must be conducted in an anhydrous inert atmosphere. Because of the reactivity of niobium, in particular, with both elemental oxygen and elemental hydrogen, it is necessary for said atmosphere to be free from elemental oxygen, and in step D also from elemental hydrogen. Inert gases such as argon and helium may be employed for this purpose. Argon is, however, usually obtained from air and may contain minor proportions of oxygen. Therefore, helium is the preferred inert atmosphere material.

In step C, a connecting superconductive alloy layer is deposited on said tape ends. This is accomplished by a CVD reaction between hydrogen and halides of the parent and reactive metals. Any halides of said metals may be employed, in substantially pure form or as constituents of a mixture. The preferred halides are the chlorides, of which examples are tin tetrachloride, niobium pentachloride and germanium tetrachloride. They may be employed as such and/or may be prepared by passage of chlorine over a body of elemental metal, most often niobium or germanium.

The CVD reaction takes place at a temperature in the range of about 700°–950° C., preferably about 800°–900° C., and typically at atmospheric or near-atmospheric pressure. It is typically achieved by interrupting the flow of inert gas and replacing it with a flow of the metal halides and hydrogen, or by directing a mixed flow of inert gas and chlorine over at least one elemental metal and combining the resulting mixture of helium and metal chloride with hydrogen and any other metal chloride employed.

To avoid premature reaction between the hydrogen and metal halide(s), it may be advisable, particularly if they are introduced at elevated temperatures, to initiate contact between them only at the time of entry into the vessel in which the tape ends are contained. They may be introduced through separate ports.

Pressures in the reaction vessel during the CVD reaction are typically atmospheric or, preferably, slightly above atmospheric to suppress entry by oxygen- and moisture-containing gases. Ratios of gases—inert gas to reactive gases and hydrogen to metal halide—do not appear to be critical provided a sufficient amount of metal halide is employed to deposit the required amount of metal.

Molar ratios of the metal halides used in the CVD reaction are not usually stoichiometric (e.g., 3 moles of Nb to 1 mole Sn) but vary according to the reaction conditions. Ratios of the order of about 1:4 (Nb:Sn) are typical when chlorides of both metals are employed as such. When niobium chloride is prepared by passage of chlorine over elemental niobium in certain laboratory equipment, it may be necessary to employ an excess of chloride with respect to said ratio. It is believed that the higher proportion of chlorine required in the latter instance is the result of a portion of the chlorine not coming into contact with the metallic niobium. In any event, the precise proportions to be used may be determined by simple experimentation.

Step D is the cooling of the joined tape ends, most often to a temperature below about 40° C. This must also be performed in an inert anhydrous atmosphere free from elemental hydrogen and elemental oxygen, typically with the employment of inert gas identical or similar to that employed during step C. The inert atmosphere is necessary at this stage to aboid the formation of friable oxides or hydrides of parent metal, especially niobium, which are often preferentially formed if any oxygen, hydrogen or moisture contacts the superconducting layer. In general, the flow of metal chlorides and hydrogen is immediately replaced by a flow of inert gas such as helium before the cooling step begins, and said flow is maintained as the tape ends are cooled.

Step E is the deposition on the joined tape ends, having deposited thereon the superconducting layer, of a pure metal layer which will accept solder. A metal layer is necessary because of the lack of availability of solders which wet niobium or alloys thereof. It must be pure by reason of the required high electrical conductivity of the solder-accepting layer, which must be effective to suppress the formation of "hot spots" which might quench superconductivity.

If any oxide of the superconductive material(s) has been formed, it must be removed before the pure metal layer is applied. This is typically achieved by contacting the joined tape ends with an aqueous hydrofluoric acid solution, typically about 40-60% HF by weight, preferably by immersion.

Suitable pure metals include nickel, gold and platinum, which are normally deposited by conventional electrolytic means. Electroless deposition is generally not acceptable since it often involves the use of other elements in the form of phosphorus compounds, for example. The preferred metal under most circumstances is nickel, by reason of its relatively low cost and particular suitability.

The superconducting joints may be tested for superconductivity following the completion of step E. Before use, however, it is necessary to cover the joined tape ends with a cladding layer, which constitutes step F of the method. This is typically achieved by applying to the pure metal layer a conventional solder, typically a tin-lead solder, followed by a copper cladding material similar or identical to that present on superconducting tape.

The product obtained by the above-described method is a superconducting joint between multiple lengths of superconducting tape. Only two such lengths are usually involved, although it is within the scope of the invention to produce a branching joint from three or even more lengths.

The drawings illustrate an apparatus according to the present invention in which step C of the above-described method may be conducted. Said apparatus, generally designated 10, includes a vessel in which the CVD reaction is performed, said vessel including housing 1 and top plate 8. Said vessel is constructed of suitable material resistant to metal halides in the vapor state, with glass being particularly advantageous for most of housing 1 and substantially chemically inert metal for top plate 8.

Figure 2:
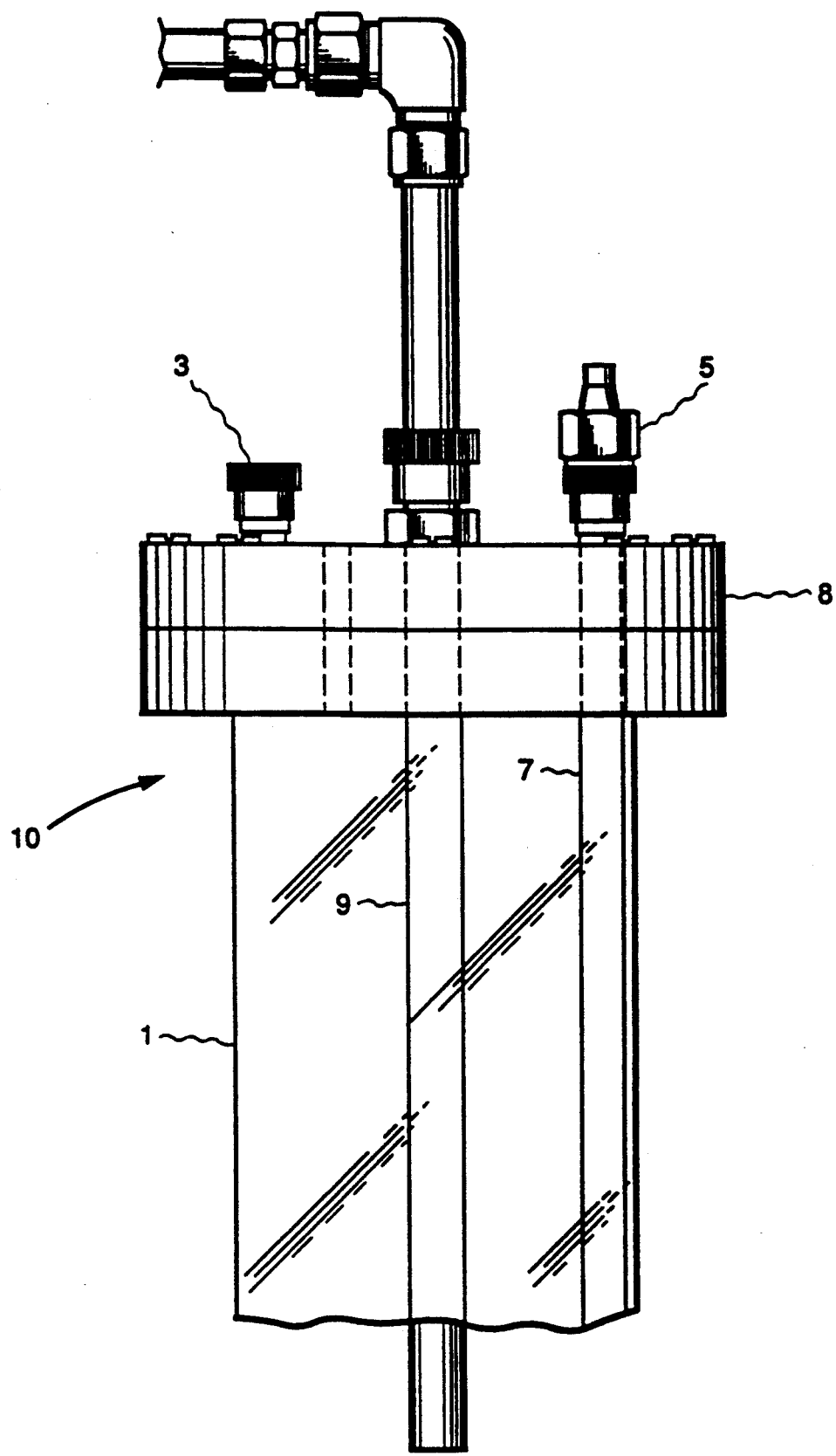
Figure 4:
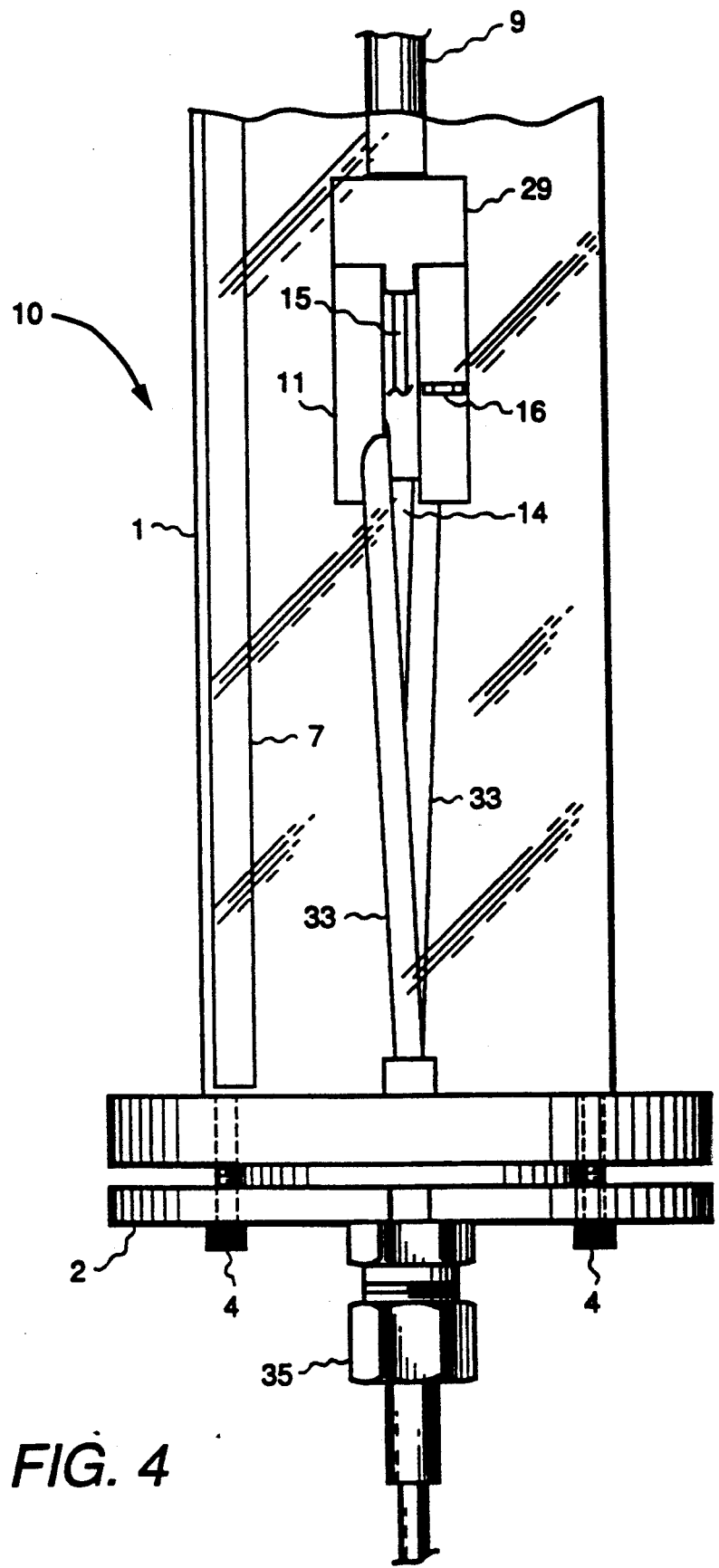
FIG. 4 is an axial view of the same apparatus along the line 3—3 of FIG. 1.

Gases are fed to the vessel through inlets 5 and 9, shown in FIG. 2: reactant gases through inlet tube 9 which terminates in proximity to the form described hereinafter (as shown in FIGS. 1 and 4), and inert purge gas through inlet 5, passing via feed tube 7 to near the bottom of said vessel (as shown in FIG. 4) to facilitate rapid and efficient displacement of reactant gases by inert gas when the CVD operation has been completed. The gaseous contents are removed from vessel 1 through vent 3. The length of vessel 1 is typically about 25-50 cm.

Figure 3:
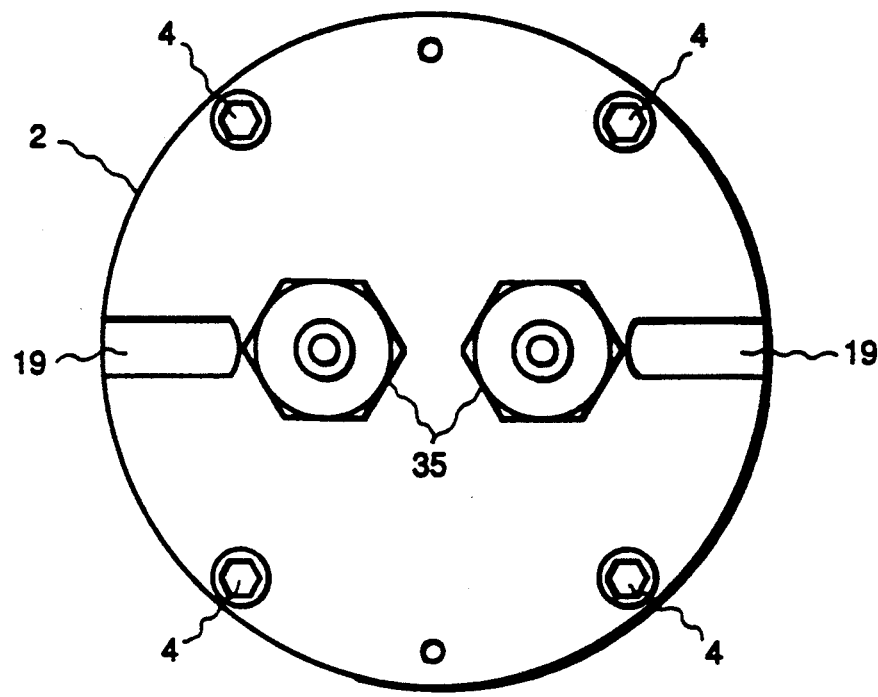
FIG. 3 is a view corresponding to that of FIG. 1, but orthogonally directed and showing the apparatus assembled.

Base plate 2 is sealably fastened to housing 1 by bolts 4, the seal being provided by rubber O-ring 23. As shown in FIG. 3, entry slots 19 for superconducting tape are cut into the periphery of base plate 2; each of said tape entry slots is lined with a seal (not shown) of soft resilient material, typically silicone rubber, to prevent breakage of the tape.

Form 11, cylindrical in shape and typically about 4-6 cm. in diameter, is fabricated of a suitable chemically inert, electrically insulating and heat-resistant material such as alumina, silicon nitride, silicon carbide or hexagonal boron nitride, the latter often being preferred. It is fitted with gap 13 and groove 14, said gap having a circumferential width of about 1-2 cm. and said groove being cut in the circumference of the form in the area of contact with the superconducting tape and having a width to accomodate said tape.

Current clamps 29, typically constructed of a relatively soft, heat-resistant and electrically conductive material such as graphite, are electrically powered via rigid leads 33 which are fastened to face plate 2 and which rigidly pass through form 11 so that the face plate, leads, current clamps and form are of unitary construction. Said leads 33 are insulated from the face plate by insulators 34 and fastened thereto by fittings 35. Said current clamps are attached to form 11 by bolts 16 (only one being shown in FIG. 4), in such a way that they can be securely fastened so as to prevent movement of superconducting tape when mounted in the apparatus as explained hereinafter.

Following the physical joining of two lengths of superconducting tape according to step B of the above-described method, apparatus 10 is disassembled by removal of face plate 2 and attached parts from housing 1. Current clamps 29 are loosened and an internal length (i.e., a length not including an end) of tape 15, including the joint, is firmly seated in groove 14 of form 11, with the joint between the two tape portions bridging gap 13. Current clamps 29 are then tightened so as to secure the tape in place, and face plate 2 is fastened to housing 1 by means of bolts 4. A substantially hermetic seal is provided upon closure, by O-ring 23 and the seals on entry ports 19.

Upon passage of an electric current through said clamps, the tape joint which is exposed via gap 13 are heated to a temperature at which the CVD reaction takes place. Prior to current passage, an inert gas such as helium is supplied to the vessel via inlet 5; it is replaced (at least in part) by reactive metal halide and hydrogen gases introduced via inlet 9. The pressure in the vessel is at least atmospheric, and preferably slightly greater than atmospheric to prevent entry of atmospheric gases.

Upon heating the exposed region of the tape ends to a temperature in the range of about 700°–950° C., chemical vapor deposition of the superconductive alloy layer thereon takes place. When a layer of suitable thickness has been formed, the flow of reactive gases is discontinued and the apparatus charged again with inert gas and cooled. Bolts 4 are removed, housing 1 and face plate 2 are separated and bolts 16 securing current clamps 29 are also loosened so that the joined tape can be removed for further processing. Another tape joint can then be secured in the apparatus and the process repeated.

It will be apparent to those skilled in the art that the invention is not limited by the above description of illustrative means for performing the various functions of the apparatus. For example, other termination points for the gas feed means are possible or the form may be elliptical or may have some other curved form rather than being cylindrical. Other possible variations will be apparent to those skilled in the art.

What is claimed is:

1. Apparatus for forming a superconductive joint, said apparatus comprising:
   a closable vessel resistant to metal halides in the vapor state, comprising a housing and a top plate;
   feed means in said vessel for reactive and inert gases;
   exhaust means in said vessel for venting by-product gases;
   base means adapted for sealable mounting to form the closure of said vessel;
   entry slots in said base means to accommodate an internal length of an elongated superconductor, said entry slots being adapted to sealably contact said superconductor when said base means is mounted in said vessel;
   forming means for forming a superconductive joint in said superconductor, said forming means comprising a chemically inert, electrically insulating and heat-resistant curved mount for said superconductor with a gap in the surface thereof;
   heat-resistant securing means for securing said superconductor to said forming means; and
   current passage means for passing an electric current through said superconductor when in contact with said forming means.

2. Apparatus according to claim 1 wherein said reactive gas feed means includes an inlet tube terminating in proximity to said forming means.

3. Apparatus according to claim 1 wherein said inert gas feed means includes a feed tube terminating near the bottom of said vessel.

4. Apparatus according to claim 1 wherein said forming means is cylindrical in shape.

5. Apparatus according to claim 4 wherein said forming means has a groove in the circumference thereof in the area of contact with the superconductor and of a width to accommodate said superconductor.

6. Apparatus according to claim 4 wherein said forming means is fabricated of hexagonal boron nitride.

7. Apparatus according to claim 4 wherein said securing means are fabricated of graphite.

8. Apparatus according to claim 1 wherein said base means, forming means, securing means and current passage means are of unitary construction with said current passage means being electrically insulated from said base means.

9. Apparatus for forming a superconductive joint, said apparatus comprising:
   a closable vessel resistant to metal halides in the vapor state, comprising a housing and a top plate;
   a feed tube in said vessel for reactive gases;
   a feed tube in said vessel for inert gases, terminating near the bottom of said vessel;
   exhaust means in said vessel for venting by-product gases;
   a base plate adapted for sealable mounting to form the closure of said vessel;
   entry slots in said base plate to accommodate an internal length of superconducting tape, said entry slots being lined with a seal of soft resilient material adapted to sealably contact said superconducting tape when said base means is mounted in said vessel;
   a cylindrical form for forming a superconductive joint in said superconducting tape, said form comprising a chemically inert, electrically insulating and heat-resistant curved mount for said superconductor with a gap in the surface thereof and a groove in the circumference thereof in the area of contact with said superconducting tape and having a width to accommodate said tape;
   said feed tube for reactive gases terminating in proximity to said form;
   a pair of current clamps for securing said superconducting tape to said form; and
   rigid current leads for passing an electric current through said superconductor when in contact with said forming means;
   said base plate, form, current clamps and current leads being of unitary construction with said current leads being electrically insulated from said base plate.

10. Apparatus according to claim 9 wherein said form is fabricated of hexagonal boron nitride.

11. Apparatus according to claim 9 wherein said current clamps are fabricated of graphite.

* * * * *